(12) United States Patent
McKean et al.

(10) Patent No.: US 11,003,583 B2
(45) Date of Patent: May 11, 2021

(54) ADAPTING CACHE PROCESSING USING PHASE LIBRARIES AND REAL TIME SIMULATORS

(71) Applicant: NetApp, Inc., Sunnyvale, CA (US)

(72) Inventors: Brian McKean, Boulder, CO (US); Sai Susarla, Bangalore (IN); Ariel Hoffman, Boulder, CO (US)

(73) Assignee: NETAPP, INC., Sunnyvale, CA (US)

( * ) Notice: Subject to any disclaimer, the term of this patent is extended or adjusted under 35 U.S.C. 154(b) by 800 days.

(21) Appl. No.: 15/496,857

(22) Filed: Apr. 25, 2017

(65) Prior Publication Data
US 2018/0024936 A1 Jan. 25, 2018

Related U.S. Application Data

(60) Provisional application No. 62/366,476, filed on Jul. 25, 2016.

(51) Int. Cl.
| | |
|---|---|
| *G06F 12/0893* | (2016.01) |
| *G06F 3/06* | (2006.01) |
| *G06F 11/34* | (2006.01) |
| *G06F 30/33* | (2020.01) |

(52) U.S. Cl.
CPC ........ *G06F 12/0893* (2013.01); *G06F 3/0689* (2013.01); *G06F 11/3409* (2013.01); *G06F 11/3447* (2013.01); *G06F 11/3457* (2013.01); *G06F 30/33* (2020.01); *G06F 2201/865* (2013.01); *G06F 2212/1021* (2013.01); *G06F 2212/601* (2013.01)

(58) Field of Classification Search
CPC .. G06F 12/0877; G06F 12/137; G06F 12/121; G06F 11/3457; G06F 11/3485; G06F 11/3495
See application file for complete search history.

(56) References Cited

U.S. PATENT DOCUMENTS

| | | | | |
|---|---|---|---|---|
| 10,152,339 | B1 * | 12/2018 | Dong | G06F 11/3034 |
| 2003/0061444 | A1 * | 3/2003 | Herbst | G06F 3/0601 |
| | | | | 711/118 |
| 2008/0071987 | A1 * | 3/2008 | Karn | G06F 12/0802 |
| | | | | 711/118 |
| 2010/0281216 | A1 * | 11/2010 | Patel | G06F 12/121 |
| | | | | 711/118 |
| 2012/0041914 | A1 * | 2/2012 | Tirunagari | G06F 12/121 |
| | | | | 706/15 |
| 2012/0079206 | A1 * | 3/2012 | Zhao | H04L 67/2852 |
| | | | | 711/134 |
| 2014/0095775 | A1 * | 4/2014 | Talagala | G06F 12/0246 |
| | | | | 711/103 |
| 2016/0342518 | A1 * | 11/2016 | Park | G06F 12/0811 |
| 2017/0004087 | A1 * | 1/2017 | An | G06F 12/0868 |

\* cited by examiner

*Primary Examiner* — William E. Baughman
(74) *Attorney, Agent, or Firm* — Haynes and Boone, LLP (57) ABSTRACT

A method, a computing device, and a non-transitory machine-readable medium for modifying cache settings in the array cache are provided. Cache settings are set in an array cache, such that the array cache caches data in an input/output (I/O) stream based on the cache settings. Multiple cache simulators simulate the caching the data from the I/O stream in the array cache using different cache settings in parallel with the array cache. The cache settings in the array cache are replaced with the cache settings from one of the cache simulators based on the determination that the cache simulators increase effectiveness of caching data in the array cache.

16 Claims, 5 Drawing Sheets

ADAPTING CACHE PROCESSING USING PHASE LIBRARIES AND REAL TIME SIMULATORS

CROSS-REFERENCE TO RELATED APPLICATIONS

This application claims priority to U.S. Provisional Application No. 62/366,476, filed on Jul. 25, 2016, which is incorporated herein by reference in its entirety.

TECHNICAL FIELD

The description relates to data storage architecture, and more specifically, to enhancing efficiency of a cache that stores input/output flows in the data storage architecture.

BACKGROUND

Networks and distributed storage allow data and storage space to be shared between devices located anywhere a connection is available. These implementations may range from a single machine offering a shared drive over a home network to an enterprise-class cloud storage array with multiple copies of data distributed throughout the world. Larger implementations may incorporate Network Attached Storage (NAS) devices, Storage Area Network (SAN) devices, and other configurations of storage elements and controllers in order to provide data and manage its flow. Improvements in distributed storage have given rise to a cycle where applications demand increasing amounts of data delivered with reduced latency, greater reliability, and greater throughput.

Storage systems rely on caching schemes to increase performance. These caching schemes use algorithms that place some data on higher performing media so that the data can be accessed with higher performance. For example, storage systems may move data from a hard disk drive into a dynamic random access memory (DRAM) cache in which the data is staged for faster access. In another example, storage systems may use a flash based cache to store data outside of the data I/O flow, yet still provide faster access to the data than from the underlying device storage, such as a hard disk drive.

Storage systems also use different tools that capture a caching scheme's ability to cache data and access the cached data. For example, a workload capture provides ability to get examples of the real world I/O flow using traces. These traces can be analyzed to determine different types of workload signatures. A workload signature is a set of parameters extracted from the I/O flow which can be used to inform and improve caching policy decisions in real-time thereby improving overall performance. Each prototypical workload signature may also be referred to as a phase. A workload can be represented as a sequence of multiple phases. Cache policy control can be implemented by monitoring the I/O flow, identifying different phases, and using the information in the phases to configure cache policies.

However, this technique does not always improve performance of the storage array. For example, there may be a workload signature that does not correspond to a phase, in which case the phase library would yield no useful information about cache policy optimization.

BRIEF DESCRIPTION OF THE DRAWINGS

The disclosure is best understood from the following detailed description when read with the accompanying figures.

DETAILED DESCRIPTION

All examples and illustrative references are non-limiting and should not be used to limit the claims to specific implementations and embodiments described herein and their equivalents. For simplicity, reference numbers may be repeated between various examples. This repetition is for clarity only and does not dictate a relationship between the respective embodiments. Finally, in view of this disclosure, particular features described in relation to one aspect or embodiment may be applied to other disclosed aspects or embodiments of the disclosure, even though not specifically shown in the drawings or described in the text.

Various embodiments include systems, methods, and machine-readable media for setting cache settings in an array cache and fine-tuning the cache settings in order to increase cache effectiveness when storing data. In an embodiment, cache settings are set in an array cache, such that the array cache stores data in an input/output (I/O) stream based on the cache settings. Multiple cache simulators simulate storing the data in the array cache, where each simulator uses different cache settings. The cache settings in the array cache are replaced with the cache settings from one of the cache simulators based on the determination that the one of the cache simulators increases effectiveness of storing data in the array cache.

In an embodiment, cache settings that are initially set in the array cache may be default cache settings. In an alternative embodiment, the cache settings that are set in the array cache may be cache settings associated with a phase that is matched to a portion or the entire I/O stream. When the cache simulators determine that the cache settings in one of the simulators are more efficient at processing the data from the I/O stream than the cache settings associated with the phase, the cache settings in the array cache are modified with the cache settings from one of the simulators. The modification may be performed in real time, such as when a storage controller stores the I/O stream in the array cache.

In an embodiment, the cache settings from one of the cache simulators can also be used to modify the cache settings associated with the phase.

Also, a portion or the entire I/O stream may not match to a phase. In this case, a new phase is created in the storage system and associated with cache settings from the one of the cache simulators. The phase and the associated cache settings are then stored in the I/O phase library to be set in the array cache in the future.

Figure 1:
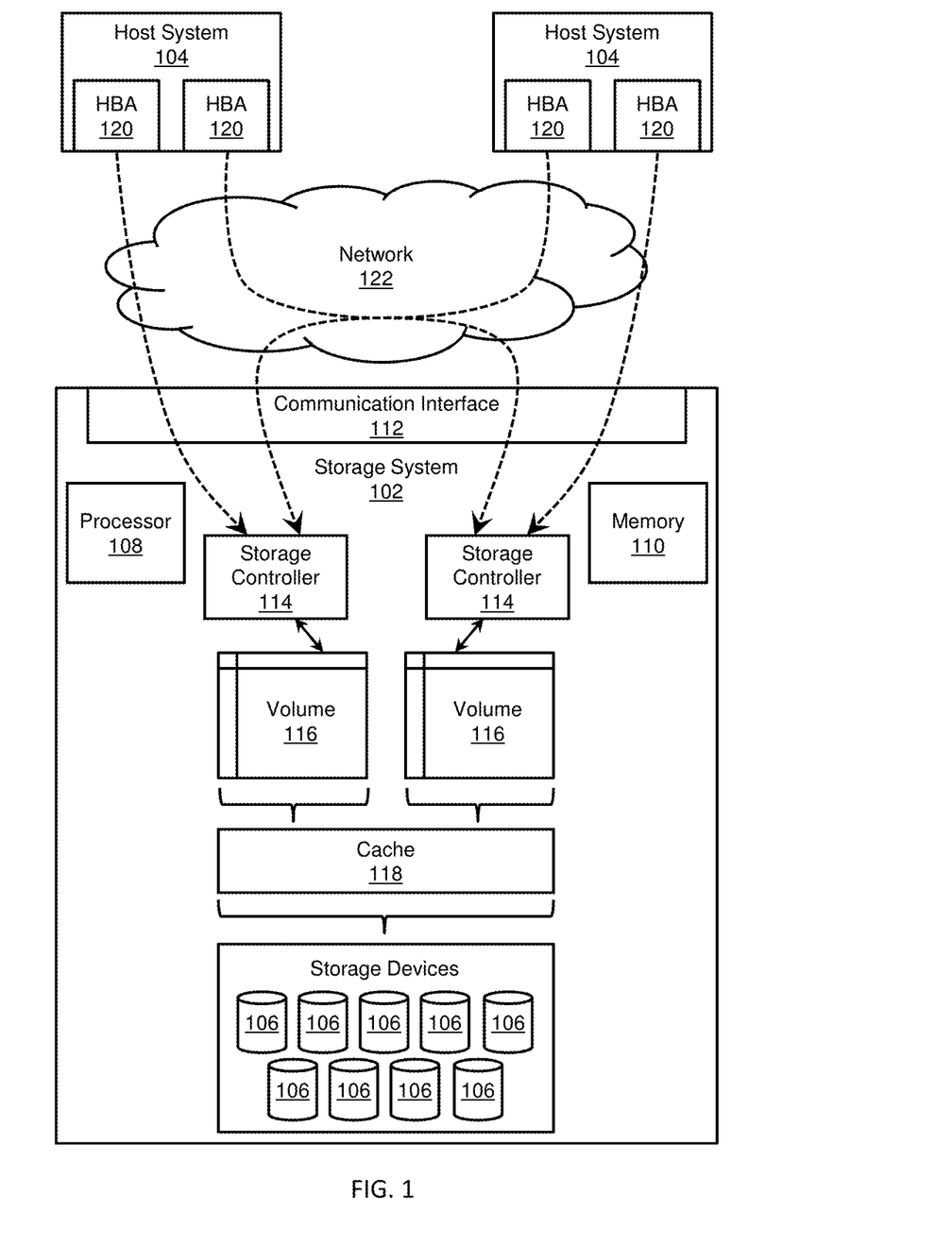
FIG. 1 is a block diagram of a data storage architecture, according to an embodiment.

FIG. 1 is an organizational diagram of a data storage architecture 100 according to aspects of the disclosure. The data storage architecture 100 includes a storage system 102 that processes data transactions on behalf of other computing systems including one or more hosts 104. It is understood that for clarity and ease of explanation, only a single storage system 102 and a limited number of hosts 104 are illustrated, although the data storage architecture 100 may include any number of hosts 104 in communication with any number of storage systems 102. An exemplary storage system 102 receives data transactions (e.g., requests to read and/or write data) from the hosts 104 and takes an action such as reading, writing, or otherwise accessing the requested data so that storage devices 106 of the storage system 102 appear to be directly connected (local) to the hosts 104. This allows an application running on a host 104 to issue transactions directed to storage devices 106 of the storage system 102 and thereby access data on the storage system 102 as easily as it can access data on the storage devices 106 of the host 104.

While the storage system 102 and the hosts 104 are referred to as singular entities, a storage system 102 or host 104 may include any number of computing devices and may range from a single computing system to a system cluster of any size. Accordingly, each storage system 102 and host 104 includes at least one computing system, which in turn includes a processor 108 such as a microcontroller or a central processing unit (CPU) operable to perform various computing instructions. The computing system may also include a memory device 110 such as random access memory (RAM); a non-transitory computer-readable storage medium such as a magnetic hard disk drive (HDD), a solid-state drive (SSD), or an optical memory (e.g., CD-ROM, DVD, BD); a video controller such as a graphics processing unit (GPU); a communication interface 112 such as an Ethernet interface, a Wi-Fi (IEEE 802.11 or other suitable standard) interface, or any other suitable wired or wireless communication interface; and/or a user I/O interface coupled to one or more user I/O devices such as a keyboard, mouse, pointing device, or touchscreen.

With respect to the storage system 102, the exemplary storage system 102 contains any number of storage devices 106 in communication with one or more storage controllers 114. The storage devices 106 of the storage system 102 may include hard disk drives (HDDs), solid state drives (SSDs), RAM drives, optical drives, and/or any other suitable volatile or non-volatile data storage medium. The storage controllers 114 exercise low-level control over the storage devices 106 in order to execute (perform) data transactions on behalf of the hosts 104, and in so doing, may group the storage devices for speed and/or redundancy using a virtualization technique such as RAID (Redundant Array of Independent/Inexpensive Disks). At a high level, virtualization includes mapping physical addresses of the storage devices into a virtual address space and presenting the virtual address space to the hosts 104. In this way, the storage system 102 represents the group of devices as a single device, often referred to as a volume 116. Thus, a host 104 can access the volume 116 without concern for how it is distributed among the underlying storage devices 106.

The storage controllers 114 may also be in communication with a cache 118 configured to cache data on behalf of the storage devices 106. The storage controllers 114 temporarily store data in cache 118 prior to flushing the data to storage devices 106. Typically, faster devices are used in higher tiers of a memory structure, and accordingly in one embodiment, the storage devices 106 includes a plurality of HDDs arranged in a Redundant Array of Independent Disks (RAID) configuration, whereas the cache 118 includes a plurality of solid state drives (SSDs) and/or random-access memory configured as a RAM disk. In a further embodiment, the storage devices 106 include a number of RAID HDDs, while the cache 118 includes a RAM disk, SSDs, or a combination of the RAM disk and SSDs at different levels. Of course, these configurations are merely exemplary, and the storage devices 106 and the cache 118 may each include any suitable storage device or devices in keeping with the scope and spirit of the disclosure. Thus, in the storage system 102 that includes both storage devices 106 and cache 118, data may be retrieved faster from cache 118 than from storage devices 106.

Turning now to the hosts 104, a host 104 includes any computing resource that is operable to exchange data with a storage system 102 by providing (initiating) data transactions to the storage system 102. In an exemplary embodiment, a host 104 includes a host bus adapter (HBA) 120 in communication with a storage controller 114 of the storage system 102. The HBA 120 provides an interface for communicating with the storage controller 114, and in that regard, may conform to any suitable hardware and/or software protocol. In various embodiments, the HBAs 120 include Serial Attached SCSI (SAS), iSCSI, InfiniB and, Fibre Channel, and/or Fibre Channel over Ethernet (FCoE) bus adapters. Other suitable protocols include SATA, eSATA, PATA, USB, and FireWire. In many embodiments, the host HBAs 120 are coupled to the storage system 102 via a network 122, which may include any number of wired and/or wireless networks such as a Local Area Network (LAN), an Ethernet subnet, a PCI or PCIe subnet, a switched PCIe subnet, a Wide Area Network (WAN), a Metropolitan Area Network (MAN), the Internet, or the like. To interact with (e.g., read, write, modify, etc.) remote data, the HBA 120 of a host 104 sends one or more data transactions to the storage system 102 via the network 122. Data transactions may contain fields that encode a command, data (i.e., information read or written by an application), metadata (i.e., information used by a storage system to store, retrieve, or otherwise manipulate the data such as a physical address, a logical address, a current location, data attributes, etc.), and/or any other relevant information. These transactions are referred to as an input/out stream (I/O stream) or an I/O flow.

When the storage controller 114 processes the I/O stream, the storage controller 114 may read the data from cache 118 and/or storage devices 106 or write data to cache 118 and/or storage devices 106. As discussed above, storage systems 102 use different caching schemes to place data on higher performing media, such as cache 118 so that the data can be stored and be accessed with higher performance. As such, storage controller 114 may use different caching schemes to store data from the I/O stream in cache 118. In an embodiment, different caching schemes may be encapsulated in cache settings. Cache settings are different parameters applied by controllers 114 to cache 118 such as cache block size, time that different data types are kept in cache 118 before being flushed to storage devices 116, whether data is written into storage devices on per volume or per workload basis, etc. In an embodiment, storage controller 114 may change the cache settings in cache 118 to further increasing cache efficiency for storing and retrieving data.

Figure 2:
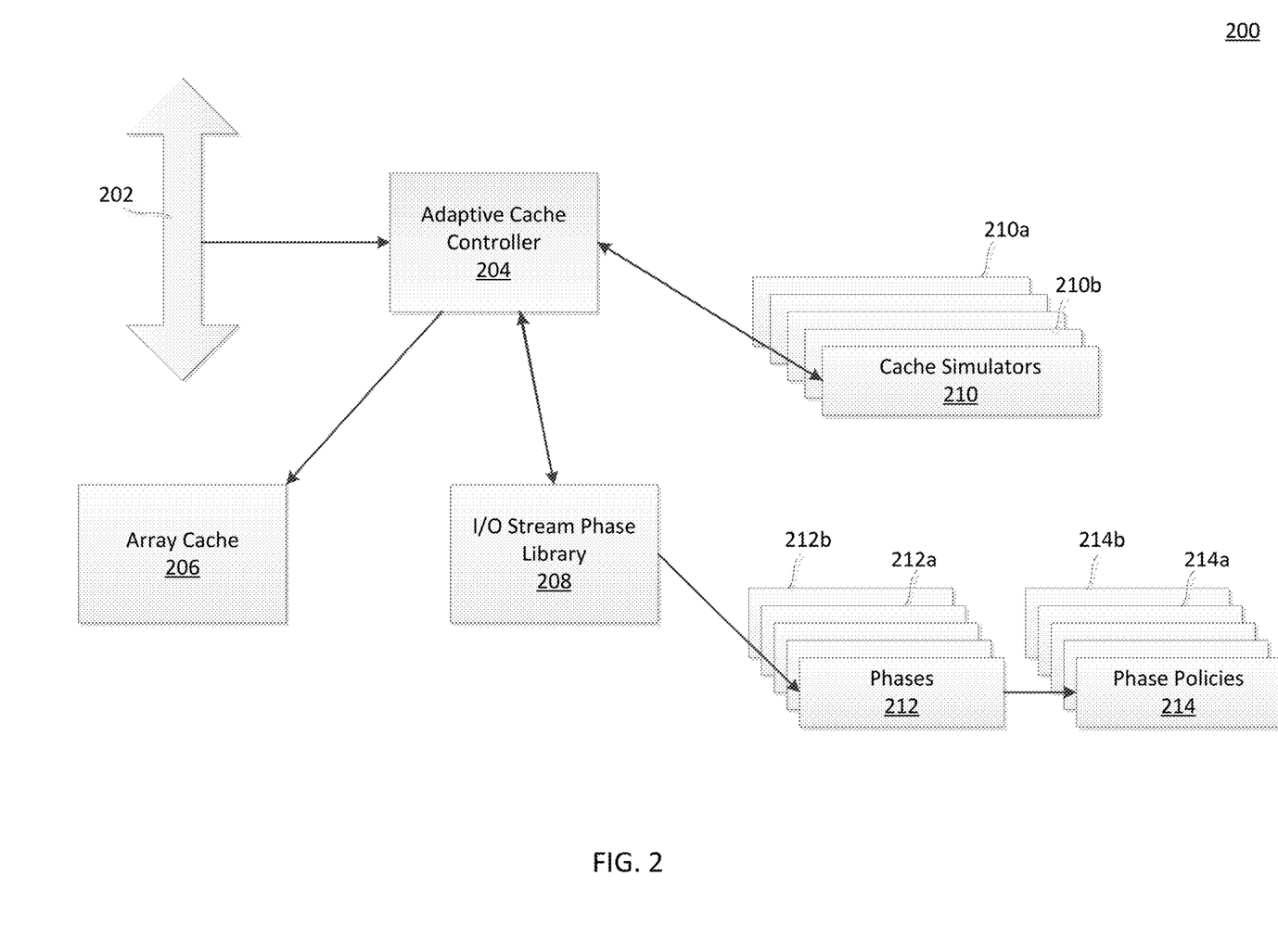
FIG. 2 is a block diagram of an adaptive cache environment, according to an embodiment.

To further better performance of cache 118, storage system 102 includes an adaptive cache environment. The adaptive cache environment may determine different settings that storage controller 114 can set for cache 118, such that cache 118 can efficiently store data from the I/O stream. FIG. 2 is a block diagram 200 of an adaptive caching environment, according to an embodiment.

The adaptive caching environment may be included in storage controllers 114 and cache 118 in one embodiment. In another embodiment, the adaptive caching environment may be communicatively coupled to storage controllers 114 and/or cache 118. For instance, in some embodiments, controllers 114 read code from computer readable media and execute that code to perform the functions to implement adaptive cache controller 204. In other embodiments, cache 118 itself may include processing capabilities to implement adaptive cache controller 204. In yet another embodiment, adaptive cache controller 204 may be implemented by a computing device (not shown) that is physically separate from storage system 202 but is in communication with storage system 202. Data and metadata of the I/O stream phase library 208 and cache simulators 210 may be stored, e.g., at cache 118 and/or at controllers 114.

The adaptive caching environment receives I/O stream 202. The I/O stream 202 may be the same I/O stream or a copy of the I/O stream that hosts 104 transmit to storage system 102, and may include one or more requests, instructions, etc., that read data from and/or write data to cache 118 and storage devices 106. In an embodiment, the adaptive cache environment uses the I/O stream 202 as input that generates new cache settings for efficiently storing data associated with the I/O stream 202 or that fine-tunes the existing cache settings.

The adaptive caching environment illustrated in FIG. 2 includes an adaptive cache controller 204, an array cache 206, an I/O stream phase library 208, and one or more cache simulators 210. In an embodiment adaptive cache controller 204 directs the processing of the I/O stream 202 to maximize efficiency of cache 118. As part of the processing, the adaptive cache controller 204 stores the I/O stream 202 in the array cache 206 and also sends the I/O stream 202 to one or more cache simulators 210.

In an embodiment, array cache 206 stores data. The data may be data associated with the data stream 202. For example, the data may be write data provided by the host 104 as part of the I/O stream 202. The data may also be data that will be provided back to the host 104 that has been uploaded to the array cache 206 from storage devices 106 or has previously been stored in the array cache 206 from other transactions with host 104. In an embodiment, array cache 206 may be a portion of cache 118 or may be cache 118.

In an embodiment, the storing of data in the array cache 206 may be controlled by the cache settings. As discussed above, cache settings are parameters that may be set or reset to efficiently store different types of data. For example, different cache settings may be applied to the array cache 206 when data that is read frequently, written frequency, modified frequently, deleted frequently, is of a particular data type, etc. And, example cache settings may include the cache block size, whether the data should be pre-fetched from storage devices 106, the time that different data types are stored in the cache, the time that the write data is stored in the cache before being flushed to the storage devices 106, whether the data is flushed on per volume 116 or per workload, etc.

In an embodiment, the adaptive cache controller 204 stores data associated with I/O stream 202 in array cache 206 and also sends a copy of the I/O stream 202 to one or more cache simulators 210. The adaptive cache controller 204 then determines whether the array cache 206 or one or more cache simulators 210 are more efficient at caching data from the I/O stream 202. In an embodiment, the adaptive cache controller 204 may also modify the cache settings based on the results from the one or more cache simulators 210.

For example, when the adaptive cache controller 204 receives the I/O stream 202, the adaptive cache controller 204 sets the cache settings in the array cache 206. These cache settings may be default settings or settings specific to a particular volume 116 or workload. The adaptive cache controller 204 then begins to cache data associated with the I/O stream 202 in the array cache 206 according to the cache settings. To further optimize data caching in the array cache 206, the adaptive cache controller 204 attempts to match portions or the entire I/O stream 202 to different phases 212. The phases 212 may be different parameters extracted from portions of previously processed I/O streams. Example parameters may include a portion of the I/O flow, number of reads that occurred when an I/O portion was processed, number of writes that occurred when an I/O portion was processed, attributes of a machine-learning algorithm (if any) used to process the I/O portion, etc. Each phase from the phases 212 is associated with one or more phase policies 214, collectively referred to as phase policies 214. The phase policies 214 include cache settings that have been previously optimized and tested to efficiently cache data in a portion of the I/O stream associated with the phase.

Continuing with the embodiment, when the adaptive cache controller 204 matches a portion or all of the I/O stream 202 to one of the phases 212, such as phase 212a, adaptive cache controller 204 accesses the phase policy, such as phase policy 214a that is associated with the phase 212a. The adaptive cache controller 204 then applies the cache settings in the phase policy 214a to the array cache 206. Once the adaptive cache controller 204 changes the cache settings in the array cache 206, the adaptive cache controller 204 continues to monitor the I/O stream 202 for changes in the phase. When the pattern of the I/O stream 202 changes, the adaptive cache controller 204 attempts to find a second phase that reflects the changes in the I/O stream 202. If a second phase is found, such as phase 212b that is associated with phase policy 214b, the adaptive cache controller 204 again modifies the array cache 206 with the cache settings from phase policy 214b. In an embodiment, the adaptive cache controller 204 repeats the process throughout the processing of the I/O stream 202.

In an embodiment, to access phases 212 the adaptive cache controller 204 uses the I/O stream phase library 208. The I/O stream phase library 208 stores I/O patters 212 and phase policies 214. In an embodiment, the I/O stream phase library 208 may be included in one of the storage devices 106 or memory 110.

The adaptive caching environment also includes one or more cache simulators, collectively referred to as cache simulators 210. Cache simulators 210 simulate the processing of the I/O stream 202 with different cache settings. These cache settings may be pre-set or pre-configured in the cache simulators 210. Alternatively, the cache simulators 210 can also use machine learning to fine-tune or reconfigure the cache settings based on previous simulations.

In an embodiment, cache simulators 210 can simulate the processing of the I/O stream 202 in real-time, and/or in parallel with the adaptive cache controller 102 caching data from the I/O stream 202 in the array cache 206. In other embodiment, cache simulators 210 may also simulate the processing of the I/O stream 202 at different times from the processing of the I/O stream 202. Also, the cache simulators 212 may simulate the processing of the I/O stream 212 sequentially, out-of-synch, or in parallel with each other.

To further fine-tune the cache settings for the I/O stream 202 or to identify a new phase that is not included in the I/O stream phase library 208, the adaptive cache controller 204 also sends the I/O stream 202 to the cache simulators 210. In an embodiment, each cache simulator may simulate the processing of the I/O stream 202 using different cache settings then the cache settings in the array cache 106. In a further embodiment, one of the cache simulators, such as cache simulator 210a can simulate the processing of the I/O stream using the same cache settings that are set in the array cache 206 for comparison purposes.

In an embodiment, as cache simulators 210 simulate the caching of the I/O stream 202 using different cache settings, the adaptive cache controller 204 may periodically sample each of the cache simulators 210. Based on the sampling, the adaptive cache controller 204 may determine that one of cache simulators, such as cache simulator 212b is more effective at accessing data from the I/O stream 202 than the array cache 206 with the set cache settings. For instance, one of cache simulators 210 that simulates using cache settings that decrease latency, increase throughput, or increase a number of cache hits may be considered more efficient. The adaptive cache controller 204 may compare latency values, throughput values, number of cache hits, or other appropriate parameters of different cache simulations 210 to the corresponding values of the cache settings in the array cache 206 to determine effectiveness. When the adaptive cache controller 204 determines that one of cache simulators 210 is more effective at accessing data from the I/O stream 202, the adaptive cache controller 204 can modify the cache settings in the array cache 206 to the cache settings used in the cache simulator 212b. In an embodiment, the adaptive cache controller 204 may change the cache settings of the array cache 206 in real-time, that is, as the I/O stream 202 is being cached, or whenever technologically possible.

In a further embodiment, the cache simulators 210 may repeatedly indicate modifications for cache settings in the array cache 206 that were set from a phase policy associated with one of the phase 212. In this case, the adaptive cache controller 204 may change the cache settings in the phase policy associated with the phase. For example, if the adaptive cache controller 204 sets cache settings in the array cache 206 from the phase policy 214a that is associated with the phase 212a, but based on the feedback from the cache simulators 210, the adaptive cache controller 204 continuously modifies the cache settings in the array cache 206 with those from the cache simulators 210, then the adaptive cache controller 204 may change the cache settings within the phase policy 214a or create a new phase policy for the phase 214a.

In an embodiment, cache simulators 210 can also generate a policy for a phase that does not exist in the I/O stream phase library 208. For example, when the I/O stream 202 does not correspond to any phase 212 in the I/O stream phase library 208, cache simulators 210 can generate a new phase policy by performing multiple simulations on the I/O stream 202 with multiple cache settings. Adaptive cache controller 204 can then select the cache settings from one of the cache simulators 210, such as the cache simulator 210a that simulates the caching of data in I/O stream 202 more efficiently than other cache simulators 210 and create a new phase policy that includes the cache settings used by the cache simulator 210a. Further, the adaptive cache controller 204 can also store the new phase and the new phase policy in the I/O stream phase library 208.

Figure 3:
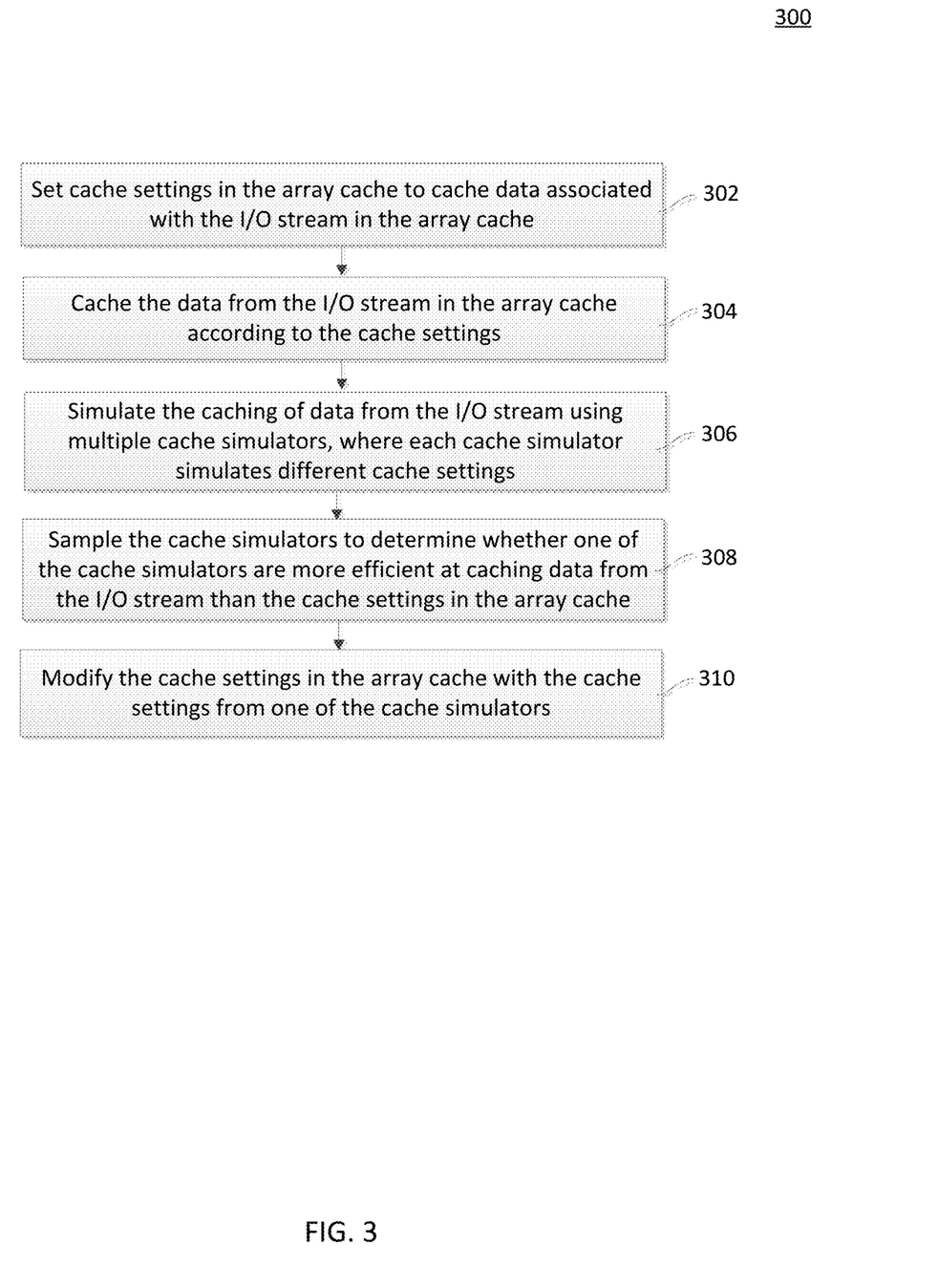
FIG. 3 is a flowchart of a method for optimizing a cache for I/O stream processing, according to an embodiment.

FIG. 3 is a flowchart of a method 300 for optimizing a cache for I/O stream processing, according to an embodiment. In an embodiment, the method 300 may be performed using hardware and software components of FIGS. 1-2.

At operation 302, the cache settings in an adaptive cache are set to cache data in the I/O stream. For example, adaptive cache controller 204 sets the settings in the array cache 206 to default settings. In another example, the adaptive cache controller 204 selects one of the phases 212 based on the I/O stream 202 and selects the phase policy associated with one of the phases 212.

At operation 304, the data in the I/O stream is cached in the array cache using the cache settings. For example, the adaptive cache controller 204 caches the data from the I/O stream in the array cache 206 according to the cache settings set in operation 302.

At operation 306, the caching of the data in the I/O stream is simulated using multiple cache simulators. For example, the adaptive cache controller 204 sends an I/O stream 202 to the cache simulators 210 where each cache simulator has different cache settings. Each cache simulator from the cache simulators 210 then simulates the caching of the data from the I/O stream using each cache simulator's respective cache settings. In an embodiment, the cache simulators 210 can simulate the caching of the data from the I/O stream 202 in parallel with each other and with the caching of the data in the array cache 206.

At operation 308, the cache simulators are sampled. For example, as cache simulators 210 simulate data caching of operation 306, the adaptive cache controller 204 samples the results of the simulations. The results may indicate whether the cache settings used by one of the cache simulators 210 to cache data from the I/O stream 202 are more efficient at caching data than the cache settings set in the array cache 206.

At operation 310, the adaptive cache controller modifies the control settings in the array cache. For example, when the adaptive cache controller 104 determines that the I/O stream 202 is more effectively processed by one of cache simulators 210, adaptive cache controller 204 modifies the cache settings in the array cache 206 to the cache settings from one of the cache simulators 210.

Figure 4:
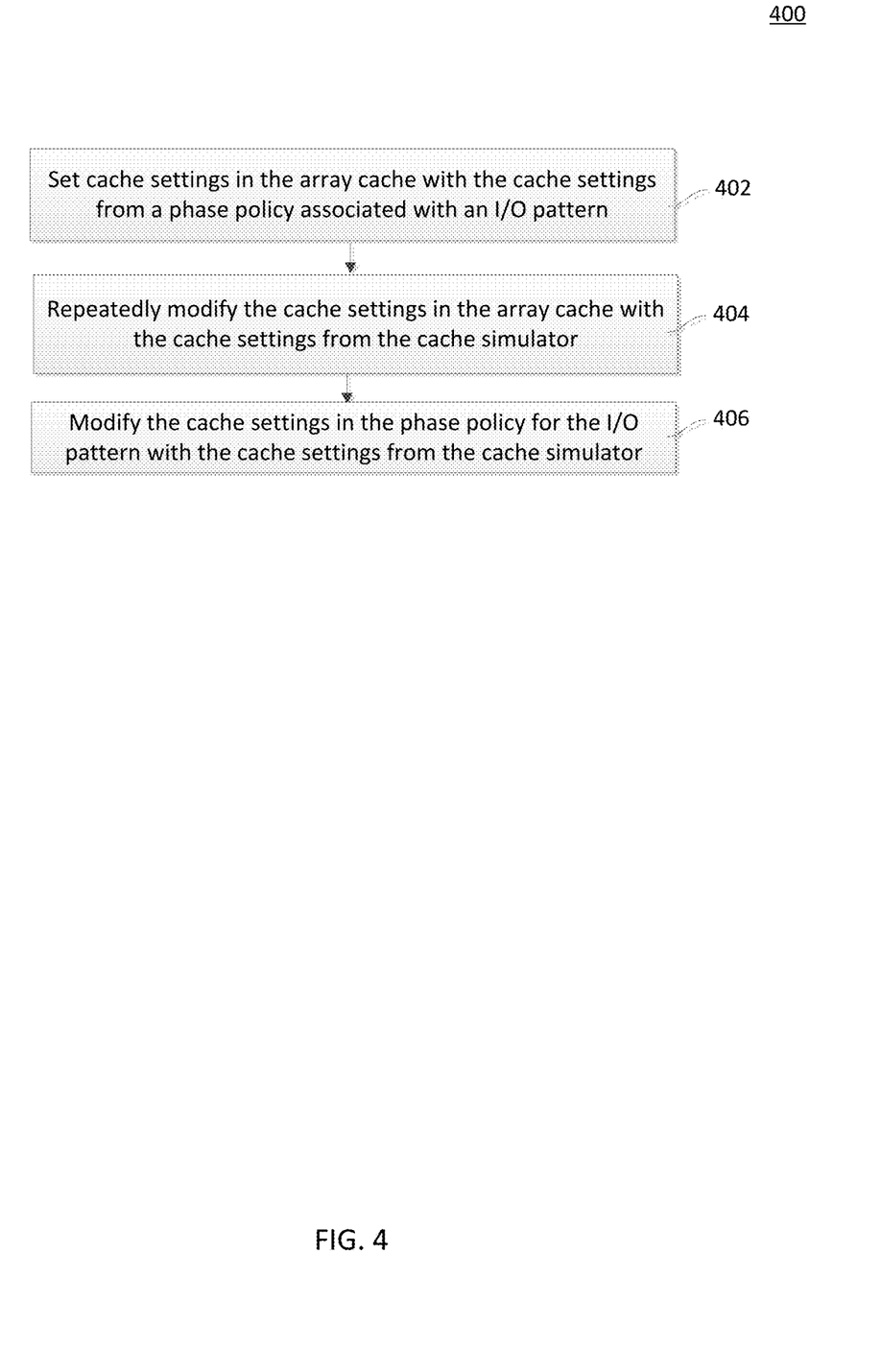
FIG. 4 is a flowchart of a method for modifying cache settings in existing phases, according to an embodiment.

FIG. 4 is a flowchart of a method 400 for modifying cache settings in existing phases, according to an embodiment. In an embodiment, the method 400 may be performed using hardware and software components of FIGS. 1-2.

At operation 402, the cache settings in the array cache are updated using a phase policy. For example, the adaptive cache controller 204 identifies the phase 212a that matches the I/O stream 202, and the phase policy 214a that is associated with the phase 212a. The adaptive cache controller 204 then updates the cache settings in the array cache 206 using the cache settings in the phase policy 214a.

At operation 404, the cache settings in the array cache are updated with the cache settings from the simulator. For example, the adaptive cache controller 204 determines that the cache simulator 210a uses cache settings that simulate the caching of data in the I/O stream 202 more efficiently than the cache setting in the array cache 206 from phase policy 214a. Based on the determination, the adaptive cache controller 204 modifies the cache settings in the array cache 206 with the cache settings from the cache simulator. In an embodiment, operation 404 may be performed multiple times using cache settings from different cache simulators 210.

At operation 406, the cache settings of the phase policy are modified. For example, adaptive cache controller 204 modifies the cache settings associated with the phase policy 214a using the cache settings determined by one or more cache simulators 210 in the operation 404.

Figure 5:
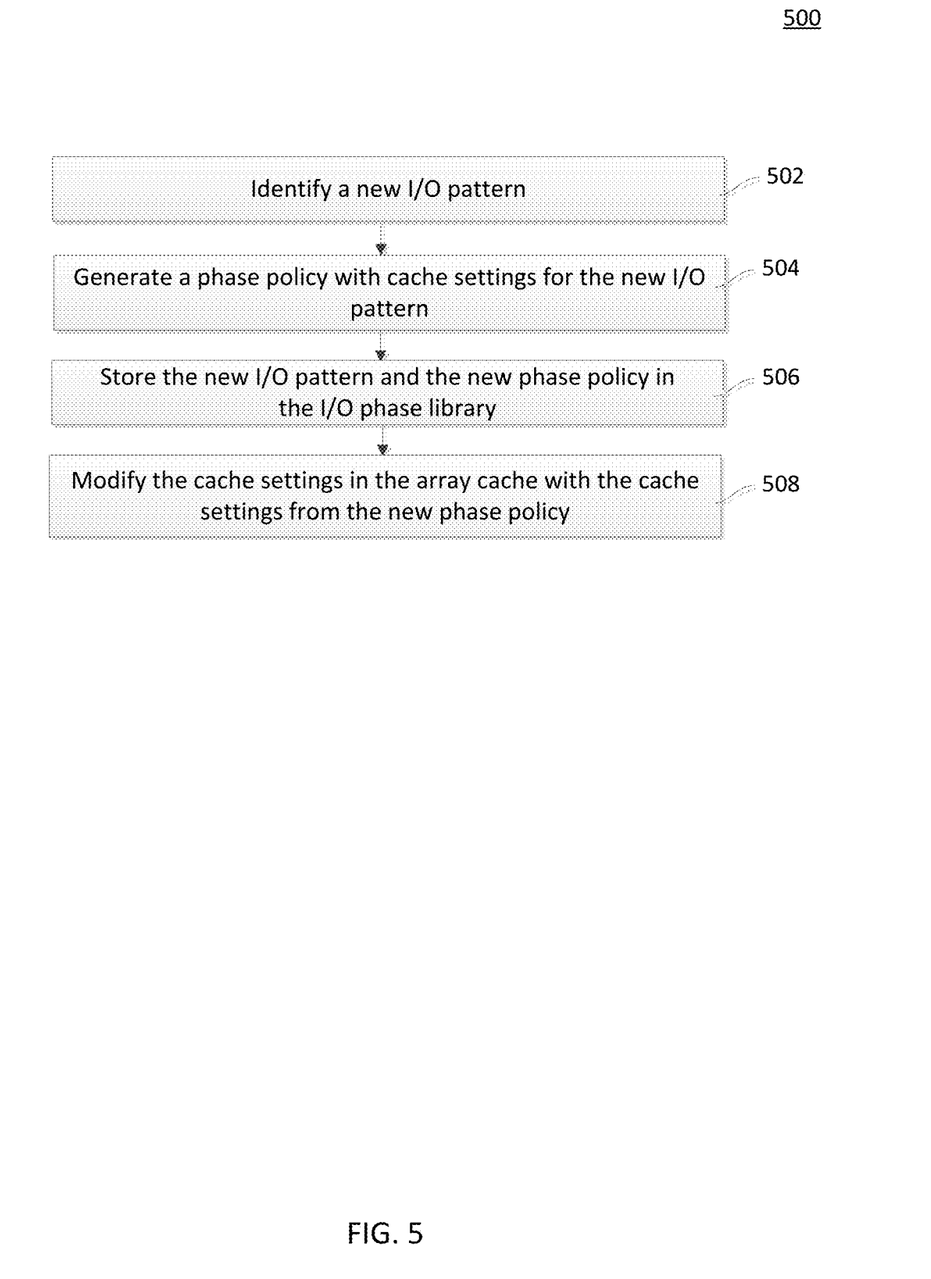
FIG. 5 is a flowchart of a method for generating a new phase and associated cache settings, according to an embodiment.

FIG. 5 is a flowchart of a method 500 for generating a new phase and associated cache settings, according to an embodiment. In an embodiment, the method 500 may be performed using hardware and software components of FIGS. 1-2.

At operation 502, a new phase is identified. For example, adaptive cache controller 204 identifies that the I/O stream 202 includes a new phase that does not exist in the I/O stream phase library 208.

At operation 504, a phase policy with cache settings is generated for the new phase. For example, the adaptive cache controller 204 sends the I/O stream 202 to the cache simulators 210, and the cache simulators 210 use the I/O stream 202 to generate a new phase policy for the new phase. Because multiple cache simulators 210 with different cache settings simulate the I/O steam 202, the cache settings that are included in the phase policy may be derived from a cache simulator that most efficiently simulates the caching of the I/O stream 202 as compared to other cache simulators 210.

At operation 506, the new phase and the new phase policy are stored. For example, the adaptive cache controller 204 stores the new phase and the new phase policy in the I/O stream phase library 208.

At operation 508, the cache settings in the array cache are modified with the cache settings from the new phase policy. For example, the adaptive cache controller 204 modifies the cache settings in the array cache 206 with cache settings from the new phase policy.

In various embodiments, the technique is performed by using various combinations of dedicated, fixed-function computing elements and programmable computing elements executing software instructions. Accordingly, it is understood that any of the steps of methods described herein may be implemented by a computing system using corresponding instructions stored on or in a non-transitory machine-readable medium accessible by the processing system. For the purposes of this description, a tangible machine-usable or machine-readable medium can be any apparatus that can store the program for use by or in connection with the instruction execution system, apparatus, or device. The medium may include non-volatile memory including magnetic storage, solid-state storage, optical storage, cache memory, and/or Random Access Memory (RAM).

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method comprising:
caching data from an input/output (I/O) stream using first cache settings;
simulating, using a plurality of cache simulators, the caching of the data from the I/O stream in an array cache, wherein each cache simulator from the plurality of cache simulators has different cache settings;
determining that second cache settings in one of the cache simulators from the plurality of cache simulators increase effectiveness of caching the data in the array cache;
modifying the first cache settings in the array cache with the second cache settings from the one of the cache simulators;
creating a new phase policy associated with the second cache settings and a parameter of the I/O stream; and
applying the second cache settings in the array cache based on the new phase policy.

2. The method of claim 1, wherein the first cache settings comprise:
default settings.

3. The method of claim 1, further comprising:
storing the first cache settings in an I/O stream phase library that is accessible to the plurality of cache simulators.

4. The method of claim 1, wherein the first cache settings determine how the array cache caches the data in the I/O stream.

5. The method of claim 1, wherein the plurality of cache simulators simulate caching of the data in the I/O stream in parallel with the data being cached in the array cache.

6. The method of claim 1, wherein the modifying is performed in real-time as the data is being cached in the array cache.

7. A computing device comprising:
a memory containing machine readable medium comprising machine executable code having stored thereon instructions for performing a method of selecting cache settings for an array cache; and
a processor coupled to the memory, the processor configured to execute the machine executable code to cause the processor to:
cache data from an input/output (I/O) stream using first cache settings;
simulate, using a plurality of cache simulators, the caching of the data from the I/O stream in an array cache, wherein each cache simulator from the plurality of cache simulators has different cache settings;
determine that second cache settings in one of the cache simulators from the plurality of cache simulators increase effectiveness in caching the data in the array cache;
modify the first cache settings in the array cache with the second cache settings from the one of the cache simulators; create a new phase policy associated with the second cache settings and a parameter of the I/O stream; and
apply the second cache settings in the array cache based on the new phase policy.

8. The computing device of claim 7, wherein the processor is further configured to execute the machine executable code to cause the processor to:
store the second cache settings in an I/O stream phase library that is accessible to the plurality of cache simulators.

9. The computing device of claim 7, wherein the first cache settings determine how the array cache caches the data in the I/O stream.

10. The computing device of claim 7, wherein the plurality of cache simulators simulate the data in the I/O stream in parallel with the data being stored in the array cache.

11. A non-transitory machine readable medium having stored thereon instructions for performing a method comprising machine executable code, which when executed by at least one machine, cause the machine to:
cache data from an input/output (I/O) stream using first cache settings;
simulate, using a plurality of cache simulators, the caching of the data from the I/O stream in an array cache, wherein each cache simulator from the plurality of cache simulators has different cache settings;

determine that second cache settings in one of the cache simulators from the plurality of cache simulators increase effectiveness in caching the data in the array cache;

based on the determination, modify the first cache settings in the array cache with the second cache settings from the one of the cache simulators;

create a new phase policy associated with the second cache settings and a parameter of the I/O stream; and apply the second cache settings in the array cache based on the new phase policy.

12. The non-transitory machine readable medium of claim 11, wherein the instructions for performing the method comprising machine executable code, which when executed by at least one machine, further causes the machine to:

store the new phase policy and the second cache settings in an I/O phase library.

13. The non-transitory machine readable medium of claim 11, wherein the instructions for performing the method comprising machine executable code, which when executed by at least one machine, further causes the machine to:

store the first cache settings in an I/O phase library.

14. The method of claim 1, further comprising:

storing the new phase policy in an I/O stream phase library that is accessible to the plurality of cache simulators.

15. The computing device of claim 7, wherein the first cache settings comprise default settings.

16. The non-transitory machine readable medium of claim 11, wherein the first cache settings comprise default settings.

* * * * *